(12) United States Patent
Tang et al.

(10) Patent No.: US 12,261,587 B2
(45) Date of Patent: Mar. 25, 2025

(54) SURFACE ACOUSTIC WAVE DEVICE

(71) Applicant: Shenzhen Newsonic Technologies Co., Ltd., Shenzhen (CN)

(72) Inventors: Gongbin Tang, Shenzhen (CN); Jie Zou, Shenzhen (CN); Bo Wang, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/639,456

(22) Filed: Apr. 18, 2024

(65) Prior Publication Data

US 2024/0305270 A1    Sep. 12, 2024

(30) Foreign Application Priority Data

Mar. 4, 2024    (CN) .......................... 202410240146.7

(51) Int. Cl.
*H03H 9/02* (2006.01)
*H03H 9/145* (2006.01)
*H03H 9/25* (2006.01)

(52) U.S. Cl.
CPC .......... *H03H 9/25* (2013.01); *H03H 9/02559* (2013.01); *H03H 9/02834* (2013.01); *H03H 9/02889* (2013.01); *H03H 9/02992* (2013.01); *H03H 9/145* (2013.01)

(58) Field of Classification Search
CPC .. H03H 9/25; H03H 9/02559; H03H 9/02834; H03H 9/02889; H03H 9/02992; H03H 9/145
USPC ...... 310/313 R, 313 A, 313 B, 313 C, 313 D
See application file for complete search history.

(56) References Cited

U.S. PATENT DOCUMENTS

| | | | |
|---|---|---|---|
| 2012/0161577 A1* | 6/2012 | Abbott | H03H 9/02724 310/313 C |
| 2013/0051588 A1* | 2/2013 | Ruile | H03H 9/1457 29/25.35 |
| 2021/0367580 A1* | 11/2021 | Kawamoto | H03H 9/6483 |
| 2022/0271734 A1* | 8/2022 | Abbott | H03H 9/6483 |

* cited by examiner

*Primary Examiner* — Derek J Rosenau
(74) *Attorney, Agent, or Firm* — Finnegan, Henderson, Farabow, Garrett & Dunner, LLP.

(57) ABSTRACT

An acoustic wave device includes a piezoelectric substrate and an interdigital transducer disposed on the piezoelectric substrate, the interdigital transducer including a center region, first and second edge regions, and first and second gap regions, a temperature compensation layer covering the interdigital transducer, and a floating metal layer buried in the temperature compensation layer or disposed on top of the temperature compensation layer. The floating metal layer includes a plurality of floating metal blocks spaced apart from each other and overlapping at least the first and second edge regions of the interdigital transducer.

20 Claims, 7 Drawing Sheets

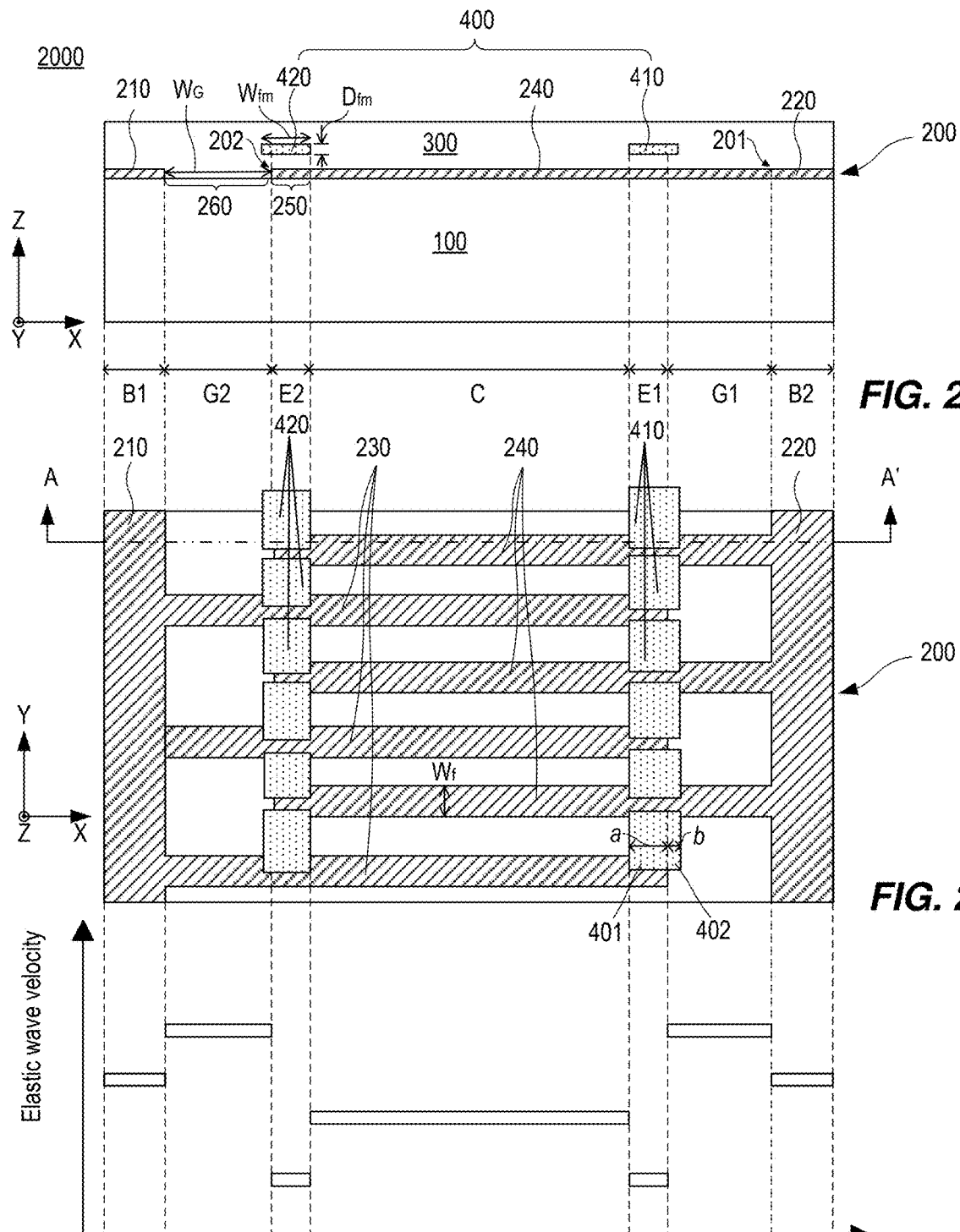
FIG. 2A
FIG. 2B
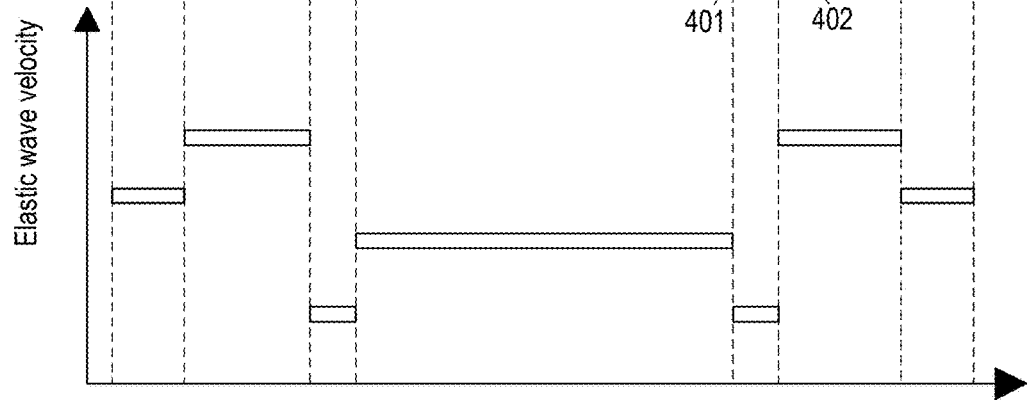
FIG. 2C

SURFACE ACOUSTIC WAVE DEVICE

CROSS-REFERENCE TO RELATED APPLICATIONS

The present application is based on and claims priority to Chinese Patent Application No. 202410240146.7, filed on Mar. 4, 2024, the entire contents of which are hereby incorporated by reference.

FIELD

The present disclosure relates to the field of semiconductor devices and, in particular, to a surface acoustic wave device.

BACKGROUND

Surface acoustic wave (SAW) devices, such as SAW resonators and SAW filters, are used in many applications such as radio frequency (RF) filters. A typical SAW filter includes a plurality of interdigital transducers (IDTs) formed on a piezoelectric substrate, and each IDT may include a plurality of interdigital electrodes. In some applications, a thin layer of silicon oxide (SiO2) may be formed on the IDTs to obtain good temperature coefficient of frequency. Such a SAW device may be implemented as a temperature compensated-surface acoustic wave (TC-SAW) device.

SUMMARY

According to one aspect of the disclosure, an acoustic wave device is provided. The acoustic wave device includes a piezoelectric substrate and an interdigital transducer disposed on the piezoelectric substrate, the interdigital transducer including a center region, first and second edge regions, and first and second gap regions, a temperature compensation layer covering the interdigital transducer, and a floating metal layer buried in the temperature compensation layer or disposed on top of the temperature compensation layer. The floating metal layer includes a plurality of floating metal blocks spaced apart from each other and overlapping at least the first and second edge regions of the interdigital transducer.

BRIEF DESCRIPTION OF THE DRAWINGS

The accompanying drawings, which are incorporated in and constitute a part of this application, illustrate disclosed embodiments and, together with the description, serve to explain the disclosed embodiments.

FIG. 2A schematically illustrates a sectional view of a temperature compensated surface acoustic wave (TC-SAW) device, according to an embodiment of the present disclosure.

FIG. 2B schematically illustrates a top view of the TC-SAW device of FIG. 2A, according to an embodiment of the present disclosure.

FIG. 2C is a velocity profile of the TC-SAW device of FIG. 2A, according to an embodiment of the present disclosure.

DETAILED DESCRIPTION

Figures 1A, 1B, 1C:
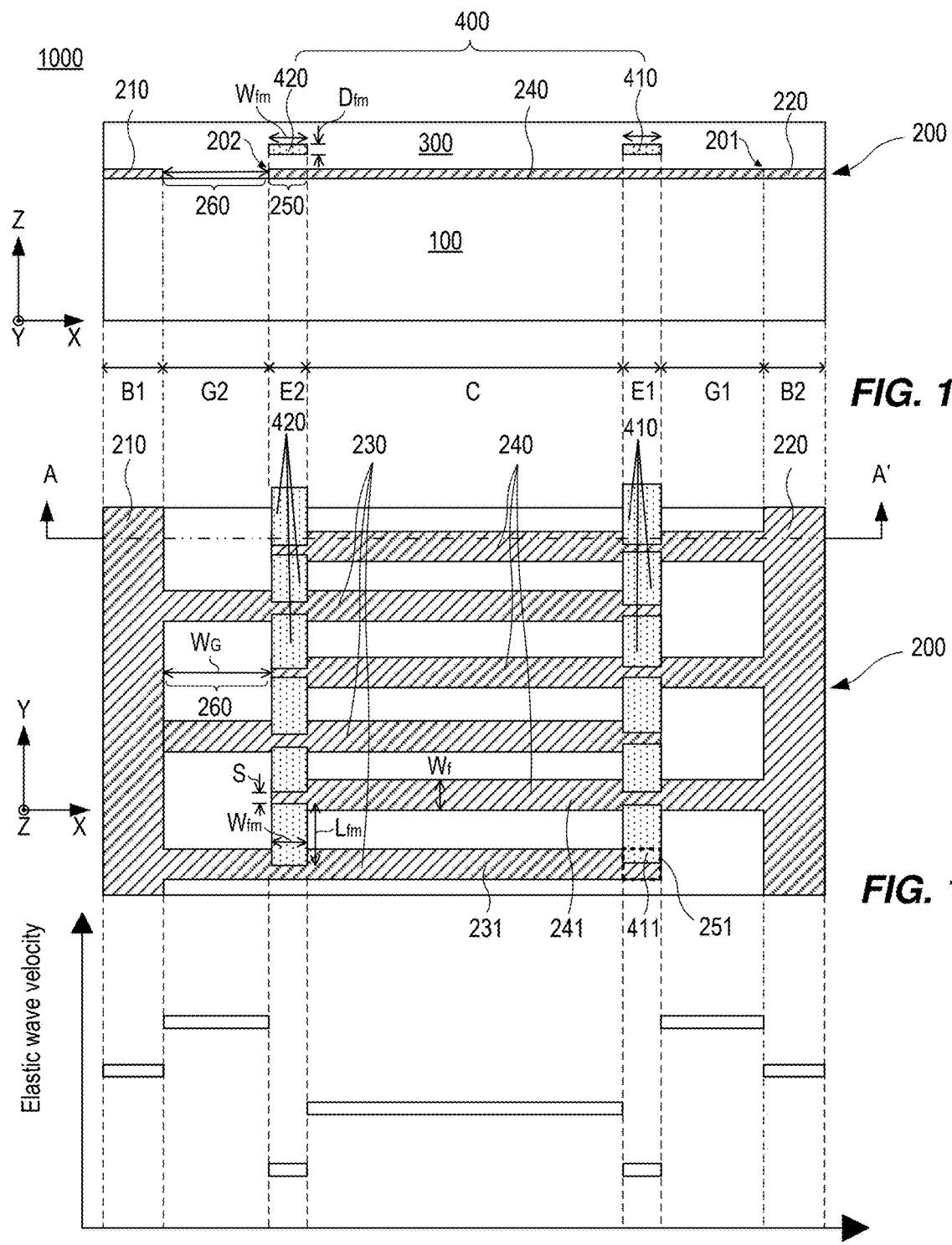
FIG. 1A schematically illustrates a sectional view of a temperature compensated surface acoustic wave (TC-SAW) device, according to an embodiment of the present disclosure.
FIG. 1B schematically illustrates a top view of the TC-SAW device of FIG. 1A, according to an embodiment of the present disclosure.
FIG. 1C is a velocity profile of the TC-SAW device of FIG. 1A, according to an embodiment of the present disclosure.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present disclosure are only for the purpose of illustrating the basic structure of the subject matter of the present disclosure. The same numbers in different drawings represent the same or similar elements unless otherwise represented.

Additionally, terms in the text indicating relative spatial position, such as "top," "bottom," "upper," "lower," "above," "below," and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (e.g., rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

A typical SAW resonator includes an interdigital transducer (IDT) formed on a piezoelectric substrate. One difficulty when designing a SAW resonator is the presence of transducer edge gap regions having an elastic wave velocity much higher than a transducer center region. The high velocity regions may result in generation of transverse mode signals in the SAW resonator, that may cause unwanted ripples in filter characteristics. A technical solution for suppressing the transverse mode is to create an edge region with a relatively slow velocity compared to the transducer center region. This may be achieved by providing a conductive stripe in the edge region. The conductive stripe may extend longitudinally across the entire length of a busbar of the interdigital transducer. The dimension of the conductive stripe is configured according to desirable characteristics and dimensions of the SAW resonator, and may not be varied. However, sometimes it might be desirable to vary the dimension of the conductive stripe.

According to embodiments of the present disclosure, a series of conductive metal blocks (hereinafter referred to as "floating metal blocks") are provided at least in the edge region. The floating metal blocks may be individually formed, and thus the dimensions of the individual floating metal blocks may be varied.

FIG. 1A schematically illustrates a sectional view of a temperature compensated surface acoustic wave (TC-SAW) device 1000, according to an embodiment of the present disclosure. FIG. 1B schematically illustrates a top view of TC-SAW device 1000 of FIG. 1A. FIG. 1C is a velocity profile of TC-SAW device 1000 of FIG. 1A. The dashed lines between FIGS. 1A, 1B, and 1C show relative positions of the illustrated components of TC-SAW device 1000. The sectional view of FIG. 1A is taken along a section line A-A' in FIG. 1B.

As illustrated in FIGS. 1A-1C, TC-SAW 1000 includes a piezoelectric substrate 100, an interdigital transducer (IDT) 200 disposed on piezoelectric substrate 100, a temperature compensation layer 300 covering IDT 200, and a floating metal layer 400 buried in temperature compensation layer 300. IDT 200 includes a center region C, first edge region E1, second edge region E2, first gap region G1, second gap region G2, first busbar region B1, and second busbar region B2. Floating metal layer 400 includes a plurality of floating metal blocks 410 and 420 spaced apart from each other and overlapping at least first and second edge regions E1 and E2 of IDT 200, respectively.

More specifically, referring to FIGS. 1B, IDT 200 includes a first busbar 210, a second busbar 220 opposite first busbar 210, a plurality of first fingers 230 extending from first busbar 210 and along a first direction (X-direction in FIGS. 1A and 1B), and a plurality of second fingers 240 extending from second busbar 220 and along the first direction. First fingers 230 and second fingers 240 are alternatively disposed along a second direction (Y-direction in FIGS. 1A and 1B) perpendicular to the first direction. Each finger among first fingers 230 and second fingers 240 has a width $W_f$ along the second direction (Y-direction in FIGS. 1A and 1B). The widths Wr of first fingers 230 may be the same as, or different from, each other. The widths $W_f$ of second fingers 240 may be the same as, or different from, each other. A ratio between the width $W_f$ of first or second fingers 230 or 240 and a distance between the centers of adjacent ones of first and second fingers 230 and 240 is defined as a duty cycle of IDT 200. In the embodiments of the present disclosure, the duty cycle of IDT 200 may be, e.g., 0.5.

Each of first fingers 230 and second fingers 240 includes a first end 201 electrically connected to one of first busbar 210 and second busbar 220 and an opposite second end 202 having an edge portion 250 spaced from the other one of first busbar 210 and second busbar 220 to define a gap 260. Edge portions 250 of first fingers 230 are disposed in first edge region E1. Edge portions 250 of second fingers 240 are disposed in second edge region E2. Gaps 260 defined between first fingers 230 and second busbar 220 are disposed in first gap region G1. Gaps 260 defined between second fingers 240 and first busbar 210 are disposed in second gap region G2.

Floating metal layer 400 includes a series of first floating metal blocks 410 and a series of second floating metal blocks 420. The series of first floating metal blocks 410 are arranged along the second direction and spaced apart from each other, and overlap first edge region E1. The series of second floating metal blocks 420 are arranged along the second direction and spaced apart from each other, and overlap second edge region E2.

Each of first floating metal blocks 410 partially overlaps an edge portion 250 of one of first fingers 230 and a portion of one of second fingers 240 adjacent to the edge portion 250 of the first finger 230. For example, as illustrated in FIG., 1B, a first floating metal block 411 partially overlaps an edge portion 251 of a first finger 231 and a portion of a second finger 241 adjacent to first finger 231. Similarly, each of second floating metal blocks 420 partially overlaps an edge portion 250 of one of second fingers 240 and a portion of one of first fingers 230 adjacent to the edge portion 250 of the second finger 240. The dimensions of first and second floating metal blocks 410 and 420 may be individually configured according to the structure of IDT 200 as well as performance parameter of TC-SAW device 1000.

Each one of first and second floating metal blocks 410 and 420 has a thickness $D_{fm}$ along a direction perpendicular to a surface of piezoelectric substrate 100 (Z-direction in FIGS. 1A and 1B). The thicknesses $D_{fm}$ of first floating metal blocks 410 may be the same as, or different from, each other. The thicknesses $D_{fm}$ of second floating metal blocks 420 may be the same as, or different from, each other.

In an embodiment, each one of first and second floating metal blocks 410 and 420 may have, e.g., a rectangular shape with a width $W_{fm}$ along the first direction (X-direction in FIGS. 1A and 1B), and a length Lim along the second direction (Y-direction in FIGS. 1A and 1B). The widths $W_{fm}$ of first floating metal blocks 410 may be the same as, or different from, each other. The widths $W_{fm}$ of second floating metal blocks 420 may be the same as, or different from, each other. Width $W_{fm}$ may be substantially equal to, or less than, one wavelength (which is also referred to as "acoustic wavelength") of the acoustic wave propagating within IDT 200. For example, width $W_{fm}$ may be 1.0 L, where L is one acoustic wavelength (e.g., 4 μm). In another embodiment, each one of first and second floating metal blocks 410 and 420 may have a shape other than the rectangular shape.

The dimensions of first and second floating metal blocks 410 and 420, such as width $W_{fm}$, length $L_{fm}$, and thickness $D_{fm}$, may be individually configured according to the structure of IDT 200 as well as performance parameter of TC-SAW device 1000. For example, a width $W_{fm}$ of each one of first and second floating metal blocks 410 and 420 is configured based on the widths Wt of one of first fingers 230 and one of second fingers 240 that the floating metal block partially overlaps. In the example of FIG. 1B where first floating metal block 411 partially overlaps first finger 231 and second finger 241, the width $W_{fm}$ of first floating metal block 411 is configured based on the width $W_f$ of first finger 231 and the width $W_f$ of second finger 241. For example, a length $L_{fm}$ of each one of first and second floating metal blocks 410 and 420 is configured based on a pitch P1 of first fingers 230 (i.e., the distance between adjacent first fingers 230) and a pitch P2 of second fingers 240 (i.e., the distance between adjacent second fingers 240). For example, $L_{dm}$= (P1+P2)/2.

Each one of first gap region G1 and second gap region G2 has a width $W_G$ along the first direction (X-direction). Width $W_G$ may be substantially equal to, or slightly greater than one acoustic wavelength. For example, width $W_G$ may be 1.5 L, where L is one acoustic wavelength (e.g., 4 µm). In some embodiments, width $W_G$ may be less than one acoustic wavelength.

As described above, the series of first floating metal blocks 410 are spaced apart from each other along the second direction (Y-direction), and the series of second floating metal blocks 420 are spaced apart from each other along the second direction (Y-direction). A distance S between adjacent ones of first floating metal blocks 410 or second floating metal blocks 420 may be less than one acoustic wavelength. For example, distance S may be between 0.2 L to 0.6 L, where L is one acoustic wavelength.

In TC-SAW 1000 according to the embodiment of the present disclosure, piezoelectric substrate 100 may be formed of a piezoelectric material such as, for example, lithium niobate (LN) or lithium tantalate (LT). IDT 200 may be formed of a metal such as, for example, Ti, Cr, Ag, Cu, Mo, Pt, W, Al, Ti, or a stacked combination of two or more of those metal materials. Temperature compensation layer 300 may be formed of a dielectric material such as, silicon oxide ($SiO_2$). In some embodiments, temperature compensation layer 300 may include a first temperature compensation layer disposed below floating metal layer 400 including floating metal blocks 410 and 420, and a second temperature compensation layer disposed above floating metal layer 400. The first and second temperature compensation layers may be formed of the same dielectric material. The thicknesses of the first and second temperature compensation layers may be the same or may be different.

Floating metal layer 400 (including first and second floating metal blocks 410 and 420) may be formed of a metal material having a relatively high density compared to the metal material of IDT. For example, floating metal layer 400 may be formed of Ti, Cr, or Cu, or a stacked combination of two or more of those metal materials. Due to the presence of the high density floating metal blocks 410 and 420 in edge regions E1 and E2, the elastic wave velocity in edge regions E1 and E2 is slower than that in the center region.

As further illustrated in FIG. 1C, the elastic wave velocity in edge regions E1 and E2 is less than that in center region C, while the elastic wave velocity in gap regions G1 and G2 is greater than that in center region C.

In the embodiment illustrated in FIGS. 1A-1C, first floating metal blocks 410 overlap only first edge region E1, and second floating metal blocks 420 overlap only second edge region E2. In some alternative embodiments, first floating metal blocks 410 may partially overlap first gap region G1, and second floating metal blocks 420 may partially overlap second gap region G2. FIGS. 2A-2C illustrates such an embodiment.

Specifically, FIG. 2A schematically illustrates a sectional view of a temperature compensated surface acoustic wave (TC-SAW) device 2000, according to an embodiment of the present disclosure. FIG. 2B schematically illustrates a top view of TC-SAW device 2000 of FIG. 2A. FIG. 2C is a velocity profile of TC-SAW device 2000 of FIG. 2A.

As illustrated in FIGS. 2A and 2B, a right side of each of first floating metal blocks 410 extends into first gap region G1 along the first direction (X-direction). That is, each first floating metal block 410 overlaps first edge region E1 and a portion of first gap region G1. Similarly, a left side of each of second floating metal blocks 420 extends into second gap region G2 along the first direction (X-direction). That is, each second floating metal block 420 overlaps second edge region E2 and a portion of second gap region G2.

Each one of first floating metal blocks 410 or second floating metal blocks 420 includes a first portion 401 that overlaps first edge region E1 or second edge region E2, and a second portion 402 that overlaps a portion of first gap region G1 or second gap region G2. A dimension of first portion 401 along the first direction (X-direction) is a, and a dimension of second portion 402 along the first direction (X-direction) is b. Dimension a may be greater than dimension b. For example, dimension a is 0.8 L, and dimension b is 0.6 L, where L is one acoustic wavelength (e.g., 400 µm).

Figure 3A:
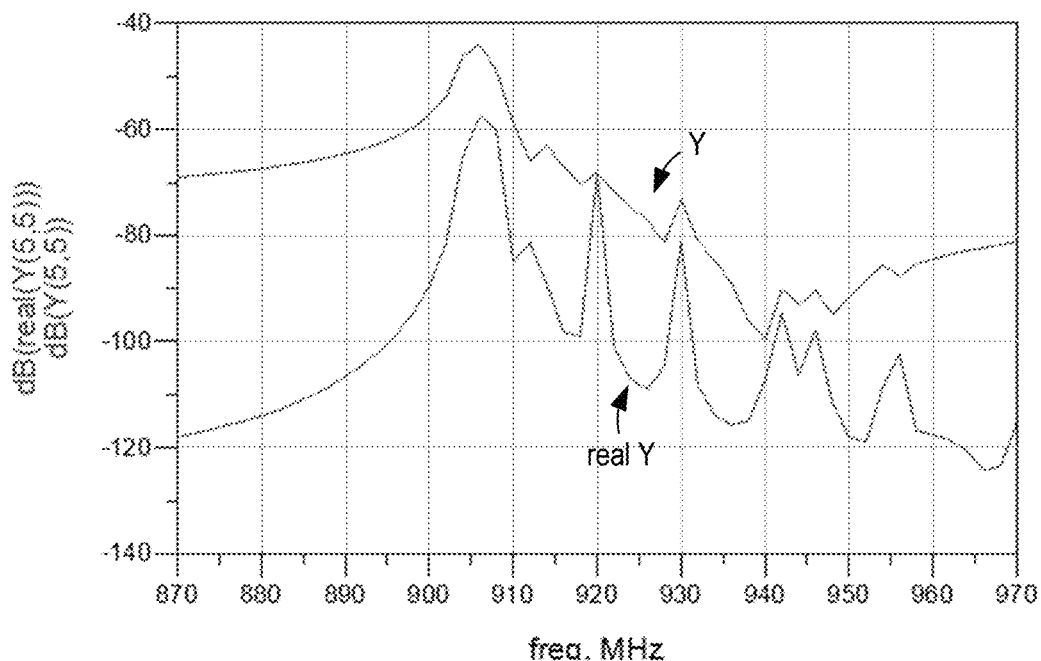
FIG. 3A is a graph showing a measurement of admittance of a TC-SAW resonator without floating metal blocks, according to a comparative example.
Figure 3B:
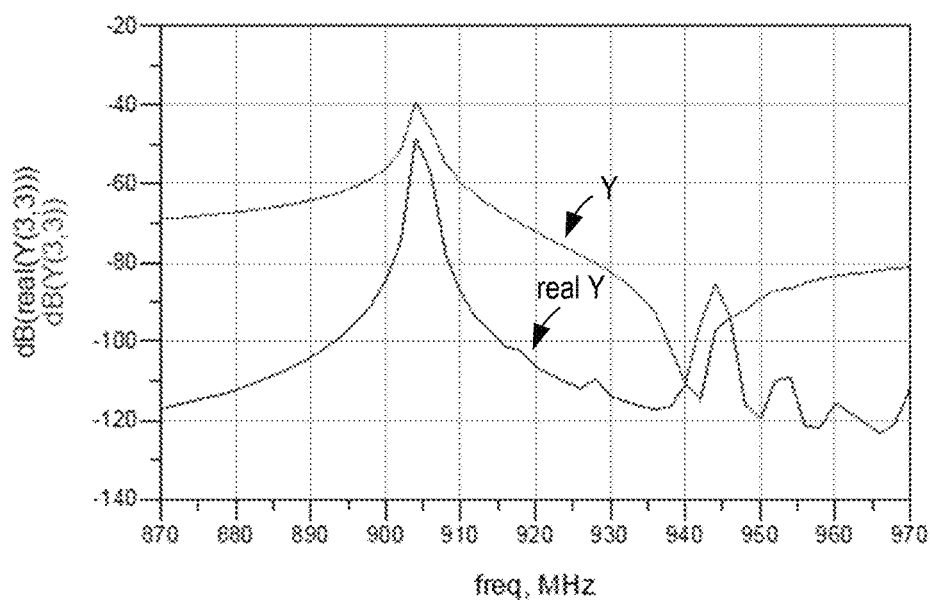
FIG. 3B is a graph showing a measurement of admittance of a TC-SAW resonator with floating metal blocks, according to the embodiments of the present disclosure.

FIG. 3A is a graph showing a measurement of admittance of a TC-SAW resonator without floating metal blocks, according to a comparative example. In the graph, the label "Y" represents the admittance, and the label "real Y" represents the real part of the admittance. As shown in FIG. 3A, a plurality of spurious responses (multiple smaller peaks) are observed between a resonant frequency around 905 MHz and an anti-resonant frequency around 940 MHz. Those spurious responses represent higher-order transverse modes. FIG. 3B is a graph showing a measurement of admittance of a TC-SAW resonator with floating metal blocks, according to an embodiment of the present disclosure. Comparing FIGS. 3A and 3B, it can be seen that the plurality of spurious responses between the resonant frequency around 905 MHz and the anti-resonant frequency around 940 MHz are significantly reduced, which means that the transverse modes generated in the SAW resonator with floating metal blocks are suppressed.

Figure 4A:
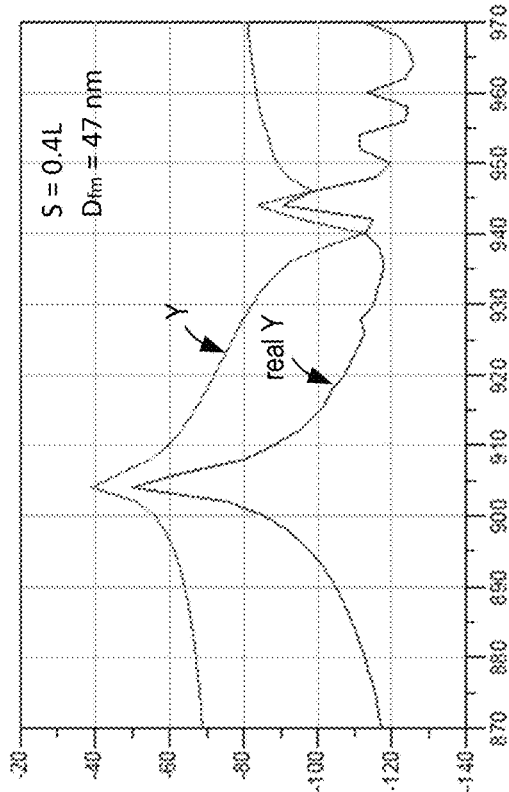
FIGS. 4A-4C are graphs showing measurement of admittance of TC-SAW resonators with floating metal blocks, according to embodiments of the present disclosure.
Figure 4B:
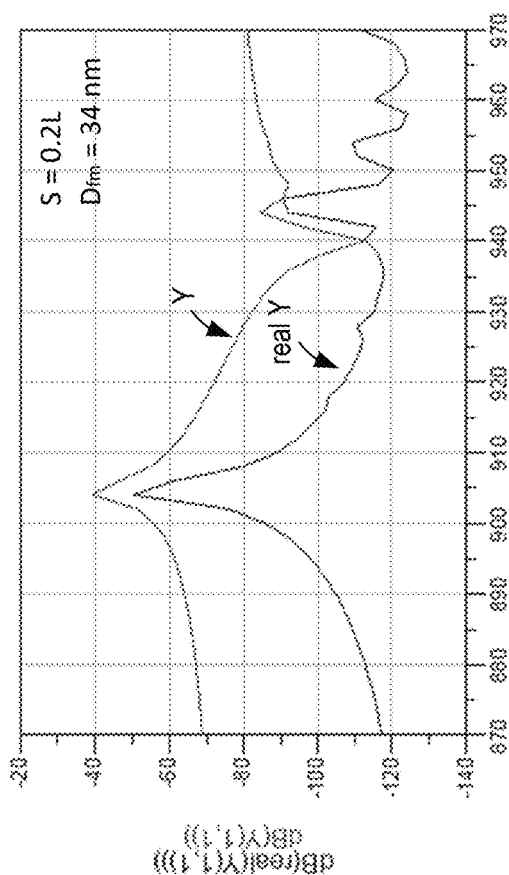
Figure 4D:
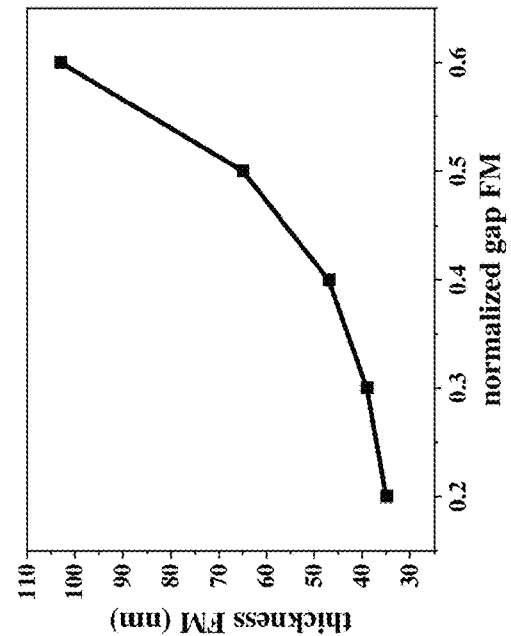
FIG. 4D is a graph showing a relationship between the distance between adjacent ones of the floating metal blocks, and the thickness of the floating metal blocks, according to embodiments of the present disclosure.
Figure 4C:
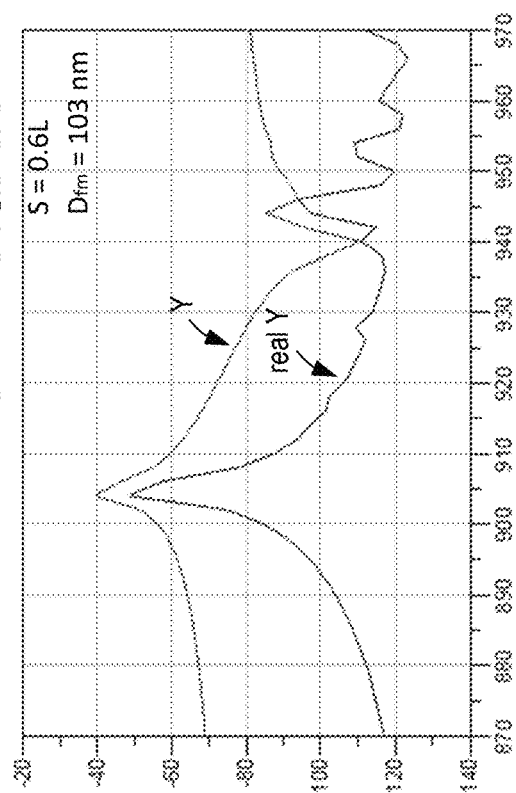

FIGS. 4A-4C are graphs showing measurement of admittance of TC-SAW resonators with floating metal blocks, according to the embodiments of the present disclosure. Specifically, in the TC-SAW resonator of FIG. 4A, the distance S between adjacent ones of floating metal blocks 410 or 420 is 0.2 L, where L is one acoustic wavelength, and the thickness $D_{fm}$ of floating metal blocks 410 and 420 is 34 nm. In the TC-SAW resonator of FIG. 4B, the distance S is 0.4 L, and the thickness $D_{fm}$ is 47 nm. In the TC-SAW resonator of FIG. 4C, the distance S is 0.6 L, and the thickness $D_{fm}$ is 103 nm. As shown in FIGS. 4A-4C, in each one of the TC-SAW resonators, the transverse mode signals are suppressed.

FIG. 4D is a graph showing a relationship between the distance S between adjacent ones of the floating metal blocks, and the thickness D of the floating metal blocks, which can suppress transverse modes. As shown in FIG. 4D, the distance S is positively related to the thickness D.

Figure 5:
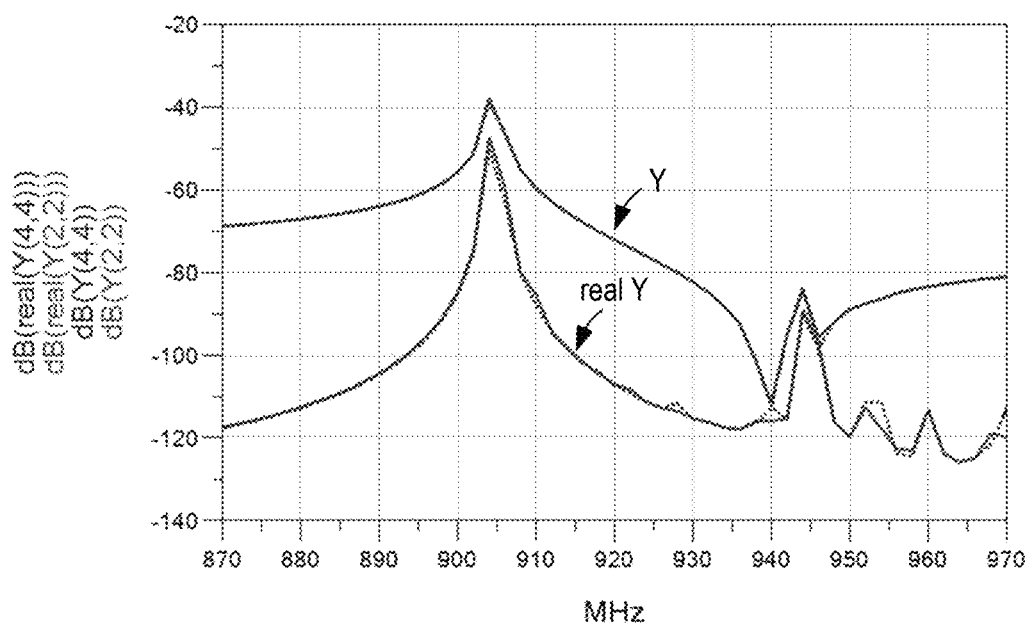
FIG. 5 is a graph showing measurement of admittance of two SAW resonators with floating metal blocks, according to embodiments of the present disclosure.

FIG. 5 is a graph showing measurement of admittance of two TC-SAW resonators with floating metal blocks, according to the embodiments of the present disclosure. In the graph, the dotted lines represent the admittance and real part of the admittance of a first TC-SAW resonator in which the floating metal blocks only overlap the edge regions, and the width $W_{fm}$ of the floating metal blocks is 0.8 L. The solid lines represent the admittance and real part of the admittance of a second TC-SAW resonator in which the floating metal blocks overlap the edge regions and a portion of the gap region. The dimension a of a first portion of each floating metal block that overlaps the edge region is 0.2 L, and the dimension b of a second portion of each floating metal block that overlaps a portion of the gap region is 0.8 L. As shown in FIG. 5, in both of the first and second TC-SAW resonators, the transverse mode signals are suppressed.

Figures 6A, 6B, 6C:
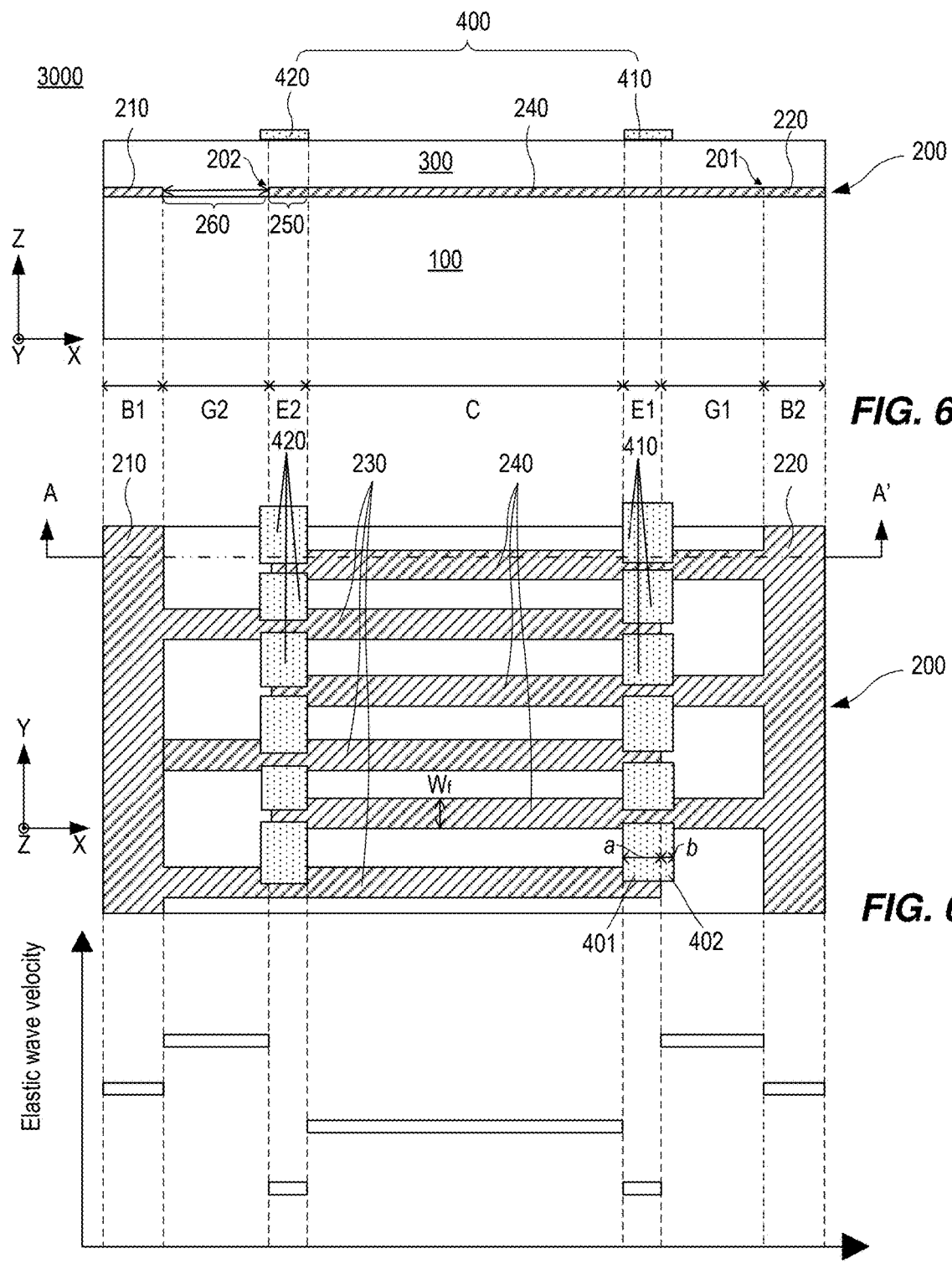
FIG. 6A schematically illustrates a sectional view of a temperature compensated surface acoustic wave (TC-SAW) device, according to an embodiment of the present disclosure.
FIG. 6B schematically illustrates a top view of the TC-SAW device of FIG. 6A, according to an embodiment of the present disclosure.
FIG. 6C is a velocity profile of the TC-SAW device of FIG. 6A, according to an embodiment of the present disclosure.

FIG. 6A schematically illustrates a sectional view of a temperature compensated surface acoustic wave (TC-SAW) device 3000, according to an embodiment of the present disclosure. FIG. 6B schematically illustrates a top view of TC-SAW device 3000 of FIG. 6A. FIG. 6C is a velocity profile of TC-SAW device 3000 of FIG. 6A.

As illustrated in FIG. 6A, floating metal layer 400 (including first floating metal blocks 410 and second floating metal blocks 420) is formed on top of temperature compensation layer 300. In other words, floating metal layer 400 is disposed on a top surface of temperature compensation layer 300 facing away from IDT 200. Other than the location of floating metal layer 400, the arrangement of components of TC-SAW device 3000 are the same as those of TC-SAW device 2000, and thus detailed descriptions thereof are not repeated.

Figures 7A, 7B, 7C:
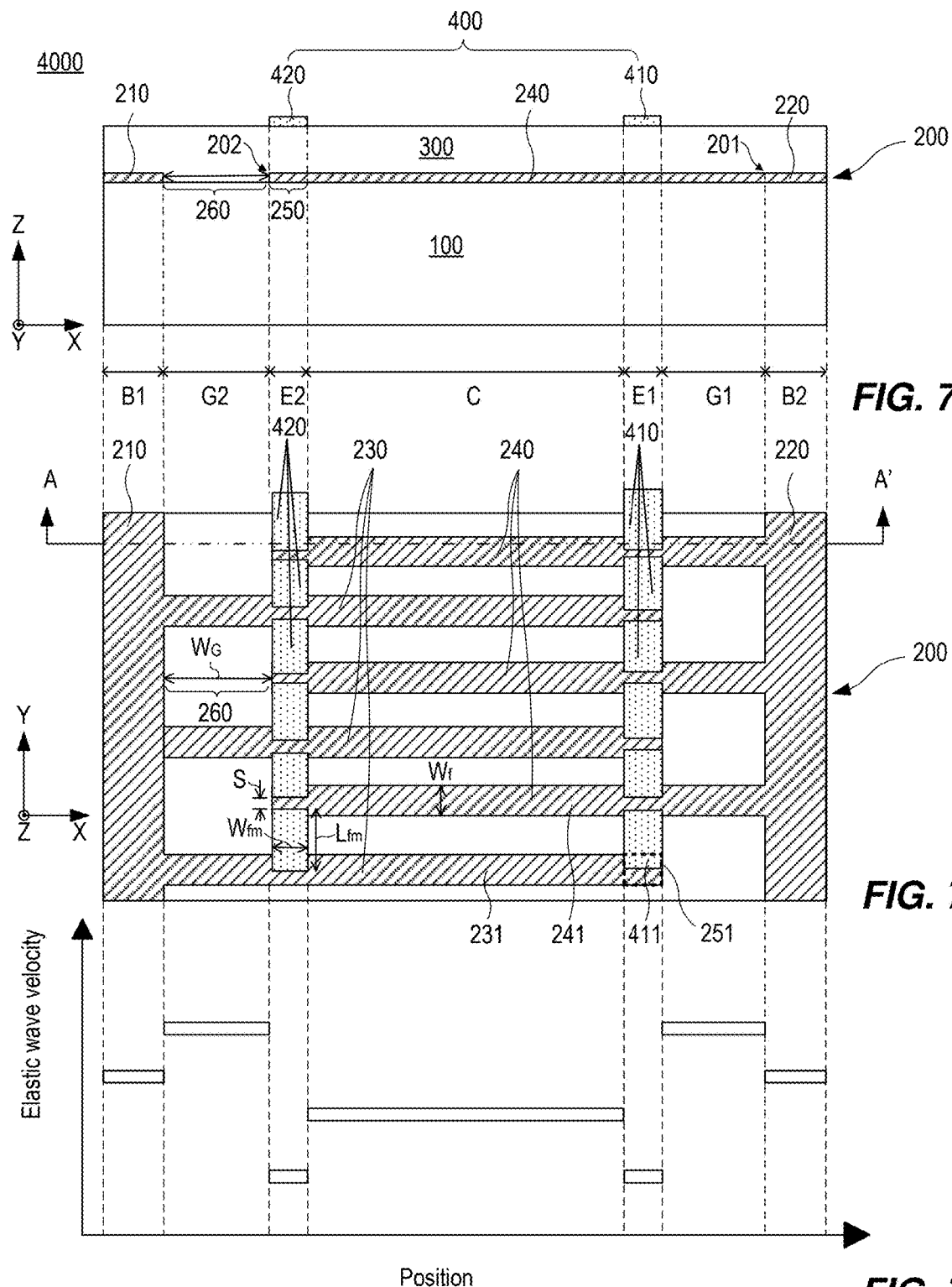
FIG. 7A schematically illustrates a sectional view of a temperature compensated surface acoustic wave (TC-SAW) device, according to an embodiment of the present disclosure.
FIG. 7B schematically illustrates a top view of the TC-SAW device of FIG. 7A, according to an embodiment of the present disclosure.
FIG. 7C is a velocity profile of the TC-SAW device of FIG. 7A, according to an embodiment of the present disclosure.

FIG. 7A schematically illustrates a sectional view of a temperature compensated surface acoustic wave (TC-SAW) device 4000, according to an embodiment of the present disclosure. FIG. 7B schematically illustrates a top view of TC-SAW device 4000 of FIG. 7A. FIG. 6C is a velocity profile of TC-SAW device 4000 of FIG. 7A.

As illustrated in FIGS. 7A and 7B, floating metal layer 400 (including first floating metal blocks 410 and second floating metal blocks 420) is formed on top of temperature compensation layer 300. In addition, first floating metal blocks 410 overlap only first edge region E1, and second floating metal blocks 420 may overlap only second edge region E2. Other than the location of floating metal layer 400, the arrangement of components of TC-SAW device 4000 are the same as those of TC-SAW device 1000, and thus detailed descriptions thereof are not repeated.

In the TC-SAW devices according to embodiments of the present disclosure, a series of floating metal blocks 410 and 420 are provided to overlap at least edge regions E1 and E2 of IDT 200. Therefore, the elastic wave velocity in edge regions E1 and E2 is less than that in center region C of IDT 200, thus suppressing transverse modes.

In addition, the floating metal blocks are spaced apart from each other. Thus, the dimensions of the individual floating metal blocks may be configured according to the structure of IDT 200 as well as desired performance parameters of the SAW device. Consequently, the performance of the SAW device can be further improved.

The embodiments of the present disclosure provide an acoustic wave device. The acoustic wave device includes a piezoelectric substrate and an interdigital transducer disposed on the piezoelectric substrate, the interdigital transducer including a center region, first and second edge regions, and first and second gap regions, a temperature compensation layer covering the interdigital transducer, and a floating metal layer buried in the temperature compensation layer or disposed on top of the temperature compensation layer. The floating metal layer includes a plurality of floating metal blocks spaced apart from each other and overlapping at least the first and second edge regions of the interdigital transducer.

In one implementation, the interdigital transducer includes a first busbar, a second busbar opposite the first busbar, a plurality of first fingers extending from the first busbar and along a first direction, and a plurality of second fingers extending from the second busbar and along the first direction. The first fingers and the second fingers are alternatively disposed along a second direction perpendicular to the first direction. Each of the first fingers and the second fingers includes a first end electrically connected to one of the first busbar and the second busbar and an opposite second end having an edge portion spaced from the other one of the first busbar and the second busbar to form a gap. The edge portions of the first fingers are disposed in the first edge region, and the edge portions of the second fingers are disposed in the second edge region.

In one implementation, the plurality of floating metal blocks include a series of first floating metal blocks arranged along the second direction and overlapping at least the first edge region, and a series of second floating metal blocks arranged along the second direction overlapping at least the second edge region.

In one implementation, each of the first floating metal blocks partially overlaps an edge portion of one of the first fingers, and one of the second fingers adjacent to the first finger, and each of the second floating metal blocks partially overlaps an edge portion of one of the second fingers, and one of the first fingers adjacent to the second finger.

In one implementation, the first floating metal blocks have different thicknesses, and the second floating metal blocks have different thicknesses.

In one implementation, the first floating metal blocks have different widths along the first direction, and the second floating metal blocks have different widths along the first direction.

In one implementation, the plurality of first fingers have different widths along the second direction, and the plurality of second fingers have different widths along the second direction.

In one implementation, a width of each floating metal block among the first floating metal blocks and the second floating metal blocks is configured based on widths of one of the first fingers and one of the second fingers that the floating metal block partially overlaps.

In one implementation, the first floating metal blocks partially overlap the first gap region, and the second floating metal blocks partially overlap the second gap region.

In one implementation, a width of each one of the first gap region and the second gap region along the first direction is less than one acoustic wavelength.

In one implementation, a width of a space between adjacent first floating metal blocks or between adjacent second floating metal blocks is less than one acoustic wavelength.

In one implementation, the piezoelectric substrate is formed of lithium niobate (LN) or lithium tantalate (LT).

In one implementation, the interdigital transducer is formed of Ti, Cr, Ag, Cu, Mo, Pt, W, Al, Ti, or a stacked combination of two or more of those materials.

In one implementation, the temperature compensation layer is formed of a dielectric material.

In one implementation, the temperature compensation layer comprises a first temperature compensation layer disposed below the floating metal layer, and a second temperature compensation layer disposed above the floating metal layer.

In one implementation, the first and second temperature compensation layers are formed of the same dielectric material.

In one implementation, the floating metal layer is formed of a metal material having a relatively high density compared to a metal material of the interdigital transducer.

In one implementation, the floating metal layer is formed of Ti, Cr, or Cu, or a stacked combination of two or more of those metal materials.

In one implementation, a duty cycle of the interdigital transducer is 0.5.

In one implementation, a distance between adjacent ones of the floating metal blocks is positively related to a thickness of the floating metal blocks.

It is appreciated that certain features of the specification, which are, for clarity, described in the context of separate embodiments, may also be provided in combination in a single embodiment. Conversely, various features of the specification, which are, for brevity, described in the context of a single embodiment, may also be provided separately or in any suitable subcombination or as suitable in any other described embodiment of the present disclosure. Certain features described in the context of various embodiments may not be essential features of those embodiments, unless noted as such.

It is appreciated that, although terms such as "first" and "second" are used herein for describing various elements, the elements should not be limited by these terms, which are only used for distinguishing the elements. For example, a first element may also be referred to as a second element, and similarly, the second element may also be referred to as the first element, without departing from the spirit and scope of the present disclosure.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

Moreover, while illustrative embodiments have been described herein, the scope of any and all embodiments having equivalent elements, modifications, omissions, combinations (e.g., of aspects across various embodiments), adaptations and/or alterations as would be appreciated by those skilled in the art based on the present disclosure. The limitations in the claims are to be interpreted broadly based on the language employed in the claims and not limited to examples described in the present specification or during the prosecution of the application. The examples are to be construed as non-exclusive. Furthermore, the steps of the disclosed methods may be modified in any manner, including by reordering steps and/or inserting or deleting steps. It is intended, therefore, that the specification and examples be considered as illustrative only, with a true scope and spirit being indicated by the following claims and their full scope of equivalents.

What is claimed is:

1. An acoustic wave device, comprising:
   a piezoelectric substrate;
   an interdigital transducer disposed on the piezoelectric substrate, the interdigital transducer comprising a center region, first and second edge regions, and first and second gap regions, and the interdigital transducer comprising a plurality of fingers extending in a first direction;
   a temperature compensation layer covering the interdigital transducer; and
   a floating metal layer buried in the temperature compensation layer or disposed on top of the temperature compensation layer,
   wherein the floating metal layer includes a plurality of floating metal blocks spaced apart from each other in a second direction perpendicular to the first direction and overlapping at least the first and second edge regions of the interdigital transducer.

2. The acoustic wave device of claim 1, wherein the interdigital transducer includes:
   a first busbar;
   a second busbar opposite the first busbar; and
   the plurality of fingers including:
      a plurality of first fingers extending from the first busbar and along the first direction; and
      a plurality of second fingers extending from the second busbar and along the first direction,
   wherein the first fingers and the second fingers are alternatively disposed along the second direction perpendicular to the first direction,
   each of the first fingers and the second fingers includes a first end electrically connected to one of the first busbar and the second busbar and an opposite second end having an edge portion spaced from the other one of the first busbar and the second busbar to form a gap,
   the edge portions of the first fingers are disposed in the first edge region, and
   the edge portions of the second fingers are disposed in the second edge region.

3. The acoustic wave device of claim 2, wherein the plurality of floating metal blocks include a series of first floating metal blocks arranged along the second direction and overlapping at least the first edge region, and a series of second floating metal blocks arranged along the second direction overlapping at least the second edge region.

4. The acoustic wave device of claim 3, wherein
   each of the first floating metal blocks partially overlaps an edge portion of one of the first fingers, and one of the second fingers adjacent to the first finger, and
   each of the second floating metal blocks partially overlaps an edge portion of one of the second fingers, and one of the first fingers adjacent to the second finger.

5. The acoustic wave device of claim 3, wherein the first floating metal blocks have different thicknesses, and the second floating metal blocks have different thicknesses.

6. The acoustic wave device of claim 4, wherein the first floating metal blocks have different widths along the first direction, and the second floating metal blocks have different widths along the first direction.

7. The acoustic wave device of claim 4, wherein the plurality of first fingers have different widths along the second direction, and the plurality of second fingers have different widths along the second direction.

8. The acoustic wave device of claim 7, wherein a width of each floating metal block among the first floating metal blocks and the second floating metal blocks is configured based on widths of one of the first fingers and one of the second fingers that the floating metal block partially overlaps.

9. The acoustic wave device of claim 2, wherein
the first floating metal blocks partially overlap the first gap region, and
the second floating metal blocks partially overlap the second gap region.

10. The acoustic wave device of claim 9, wherein a width of each one of the first gap region and the second gap region along the first direction is less than one acoustic wavelength.

11. The acoustic wave device of claim 2, wherein a width of a space between adjacent first floating metal blocks or between adjacent second floating metal blocks is less than one acoustic wavelength.

12. The acoustic wave device of claim 1, wherein the piezoelectric substrate is formed of lithium niobate (LN) or lithium tantalate (LT).

13. The acoustic wave device of claim 1, wherein the interdigital transducer is formed of Ti, Cr, Ag, Cu, Mo, Pt, W, AI, Ti, or a stacked combination of two or more of those materials.

14. The acoustic wave device of claim 1, wherein the temperature compensation layer is formed of a dielectric material.

15. The acoustic wave device of claim 1, wherein the temperature compensation layer comprises a first temperature compensation layer disposed below the floating metal layer, and a second temperature compensation layer disposed above the floating metal layer.

16. The acoustic wave device of claim 15, wherein the first and second temperature compensation layers are formed of the same dielectric material.

17. The acoustic wave device of claim 1, wherein the floating metal layer is formed of a metal material having a relatively high density compared to a metal material of the interdigital transducer.

18. The acoustic wave device of claim 17, wherein the floating metal layer is formed of Ti, Cr, or Cu, or a stacked combination of two or more of those metal materials.

19. The acoustic wave device of claim 1, wherein a duty cycle of the interdigital transducer is 0.5.

20. The acoustic wave device of claim 1, wherein a distance between adjacent ones of the floating metal blocks is positively related to a thickness of the floating metal blocks.

* * * * *

UNITED STATES PATENT AND TRADEMARK OFFICE
CERTIFICATE OF CORRECTION

PATENT NO. : 12,261,587 B2
APPLICATION NO. : 18/639456
DATED : March 25, 2025
INVENTOR(S) : Gongbin Tang et al.

Page 1 of 1

It is certified that error appears in the above-identified patent and that said Letters Patent is hereby corrected as shown below:

In the Claims

Claim 13, Column 11, Line 18, reads "AI," should read as --Al,--.

Signed and Sealed this
Sixth Day of May, 2025

Coke Morgan Stewart
*Acting Director of the United States Patent and Trademark Office*